United States Patent
Cox et al.

(10) Patent No.: US 6,438,724 B1
(45) Date of Patent: Aug. 20, 2002

(54) METHOD AND APPARATUS FOR DETERMINISTICALLY ALTERING CYCLIC REDUNDANCY CHECK INFORMATION FOR DATA STORAGE

(75) Inventors: Charles Edwin Cox; James Lee Hafner, both of San Jose; Martin Aureliano Hassner, Palo Alto, all of CA (US); Ralph Koetter, Urbana, IL (US); Arvind Motibhai Patel, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/270,069

(22) Filed: Mar. 16, 1999

(51) Int. Cl.$^7$ .................... H03M 13/15; H03M 13/29
(52) U.S. Cl. ................................. 714/758
(58) Field of Search ........................... 714/758

(56) References Cited

U.S. PATENT DOCUMENTS

| | | | |
|---|---|---|---|
| 4,410,989 A | 10/1983 | Berlekamp | 371/40 |
| 4,564,945 A | 1/1986 | Glover et al. | 371/38 |
| 4,782,490 A | 11/1988 | Tenengolts | 371/40 |
| 4,847,705 A | 7/1989 | Weng et al. | 360/49 |
| 5,027,357 A | 6/1991 | Yu et al. | 371/37.7 |
| 5,157,669 A | 10/1992 | Yu et al. | 371/37.7 |
| 5,375,127 A | 12/1994 | Leak et al. | 371/40.1 |
| 5,383,204 A | 1/1995 | Gibbs et al. | 371/37.7 |
| 5,384,786 A * | 1/1995 | Dudley et al. | 371/37.1 |
| 5,446,745 A | 8/1995 | Gibbs | 371/37.7 |
| 5,455,814 A | 10/1995 | Sako | 369/59 |
| 5,465,260 A * | 11/1995 | Zook | 371/37.7 |
| 5,491,701 A * | 2/1996 | Zook | 371/39.1 |
| 5,724,368 A * | 3/1998 | Zook | 371/37.1 |

OTHER PUBLICATIONS

Kovak et al. "ACE: A VLSI Chip for Galois Field GF ($2^m$) Based Exponentiation" IEEE Transactions on Circuits and Systems, vol. 43, No. 4, Apr. 1996.
"Magneto–Optic Data Integrity Using CRC Checksum" IBM TDB, vol. 37, No. 3, Mar. 1994.
"Some Codes that Combine ECC with Modulation" IBM TDB, vol. 32, No. 12, May 1990.

* cited by examiner

Primary Examiner—Stephen M. Baker
(74) Attorney, Agent, or Firm—Morgan & Finnegan; Khanh Q. Tran

(57) ABSTRACT

A method and apparatus for ensuring the integrity of data that can detect errors that remain when the data correction scheme fails to correct at least some of the errors, or has added additional errors. Reed-Solomon check symbols are used for error correction and cyclic redundancy check symbols are used to detect the remaining errors. The roots of the generator polynomials used to generate the Reed-Solomon check symbols and the cyclic redundancy check symbols meet a selected subset of a plurality of conditions. The roots are further selected so that the necessary exponentiation may be performed by a combination of exponentiations by powers of two and multiplications. The Reed-Solomon check symbols are generated based on the data portion of the data block. A deterministically altered data stream is generated based on the data portion of the data block and the cyclic redundancy check symbols are generated based on the deterministically altered data stream. The deterministically altered data stream is generated by performing an operation on a symbol of the data portion based on a position of the symbol within a Reed-Solomon codeword.

34 Claims, 10 Drawing Sheets

METHOD AND APPARATUS FOR DETERMINISTICALLY ALTERING CYCLIC REDUNDANCY CHECK INFORMATION FOR DATA STORAGE

FIELD OF THE INVENTION

The present invention relates generally to ensuring the integrity of transmitted or stored data, and in particular, to using cyclic redundancy check data to detect errors in Reed-Solomon encoded corrected data.

BACKGROUND OF THE INVENTION

A primary concern in the transfer of digital data is the integrity of the data. A data transfer may be from memory to a processor in a computer, from one computer to another computer over a local area network or telephone line, from a deep space probe to earth, or from storage media to a storage controller. Each type of data transfer has its own special requirements for data integrity, which depend on factors such as the inherent reliability of the transfer medium and the consequence of an error.

In some applications a simple parity check is deemed sufficient to ensure data integrity and data is simply re-sent or re-read if an error is detected. In other applications, more elaborate schemes are used to ensure data integrity, which include the ability to correct as well as to detect transmission errors. In applications, such as storage media, the increasing density of information storage requires the use of improved schemes to ensure data integrity.

A common scheme that is used to ensure data integrity is Reed-Solomon encoding. Reed-Solomon encoding provides error correction, as well as error detection. However, Reed-Solomon encoding is limited in that it cannot correct all errors. Further, a problem called miscorrection arises with Reed-Solomon encoding. When miscorrection occurs, the error correction scheme has failed to correct at least some of the errors, or has added additional errors, and incorrectly indicates that all errors have been corrected. The data is corrupt, yet it is indicated to be good. This is an unacceptable failure for a data integrity scheme. A need arises for a data integrity scheme that can detect that errors remain when miscorrection occurs.

SUMMARY OF THE INVENTION

The present invention is a method and apparatus for ensuring the integrity of data that can detect errors that remain when the data correction scheme fails to correct at least some of the errors, or has added additional errors. A block of data to be processed is received. The block of data comprises a data portion, cyclic redundancy check symbols, Reed-Solomon check symbols, and includes at least one error. The cyclic redundancy check symbols are generated using a cyclic redundancy check generator polynomial having a plurality of roots. The Reed-Solomon check symbols are generated using a Reed-Solomon generator polynomial having a plurality of roots At least one cyclic redundancy check syndrome is generated for the received block of data using the roots of the cyclic redundancy check generator polynomial. An attempt is made to correct the error in the block of data. The cyclic redundancy check syndrome is updated to correspond to the corrected block of data and it is determined whether the error has been corrected using the updated cyclic redundancy check syndrome.

The roots of the cyclic redundancy check generator polynomial meet the following conditions:

(a) the exponents of the roots are distinct values or all values modulo each prime factor of the cycle length of the underlying finite field, (b) the roots do not overlap the roots of the Reed-Solomon generator polynomial, and (c) at least one of the roots is a primitive element of the finite field.

In addition, in one embodiment of the present invention, the roots of the cyclic redundancy check generator polynomial further meet the following conditions:

(d) no root is a power of two of any other root, and (e) the roots do not overlap any power of two of any root of the Reed-Solomon generator polynomial.

In order to update the cyclic redundancy check syndromes, the location and magnitude of the error within the received data is determined using the Reed-Solomon error correction data. The location of the error within the received data is translated to the location within the cyclic redundancy check error detection data. The translated error location is exponentiated by a root of the cyclic redundancy check polynomial, this is multiplied by the error value, and then added to the cyclic redundancy check syndromes.

The roots are further selected so that the exponentiation may be performed by a combination of exponentiations by powers of two and multiplications.

The Reed-Solomon check symbols are generated based on the data portion of the data block. In one embodiment of the present invention, a deterministically altered data stream is generated based on the data portion of the data block and the cyclic redundancy check symbols are generated based on the deterministically altered data stream. The deterministically altered data stream is generated by performing an operation on a symbol of the data portion based on the position of that symbol within the Reed-Solomon codeword.

BRIEF DESCRIPTION OF THE DRAWINGS

The details of the present invention, both as to its structure and operation, can best be understood by referring to the accompanying drawings, in which like reference numbers and designations refer to like elements.

DETAILED DESCRIPTION OF THE INVENTION

Figure 1A:
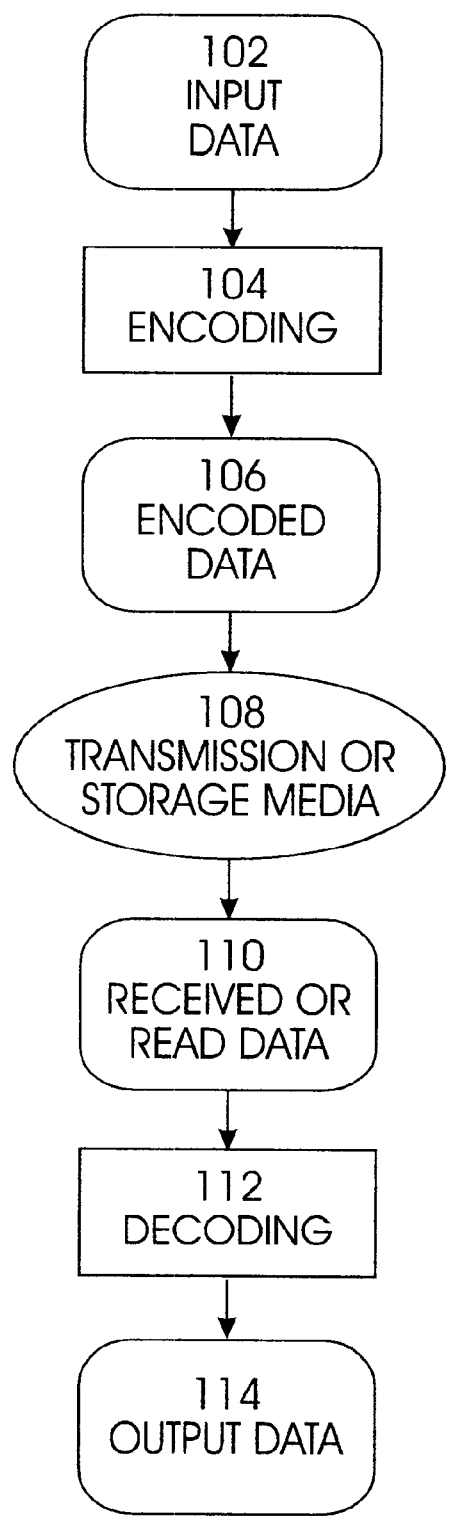
FIG. 1a is a data flow diagram of an exemplary data storage or transmission system.

An exemplary data storage or transmission system is shown in FIG. 1a. Input data 102 is received and encoded by encoding block 104. As part of the encoding process, data integrity information is generated and included with the encoded data 106. The encoded data is then transmitted through or recorded on transmission or storage media 108. Typical transmission media include radio frequency transmissions, coaxial cable, fiber optic cable, etc. Typical storage media include magnetic disk or tape, optical disk, magneto-optic disk, etc. The data is received from the transmission media or read from the storage media. The received or read data 110 is decoded in decoding block 112. As part of the decoding process, the data integrity of the received or read data is determined. The data integrity information is used to detect whether errors have occurred in the received or read data and may also be used to correct some or all such errors. Even if no errors have occurred, the integrity of the data may still be verified, which allows the system to know that the received or read data has no errors. The decoded data is then output from the system as output data 114, which is identical to input data 102.

Figure 1B:
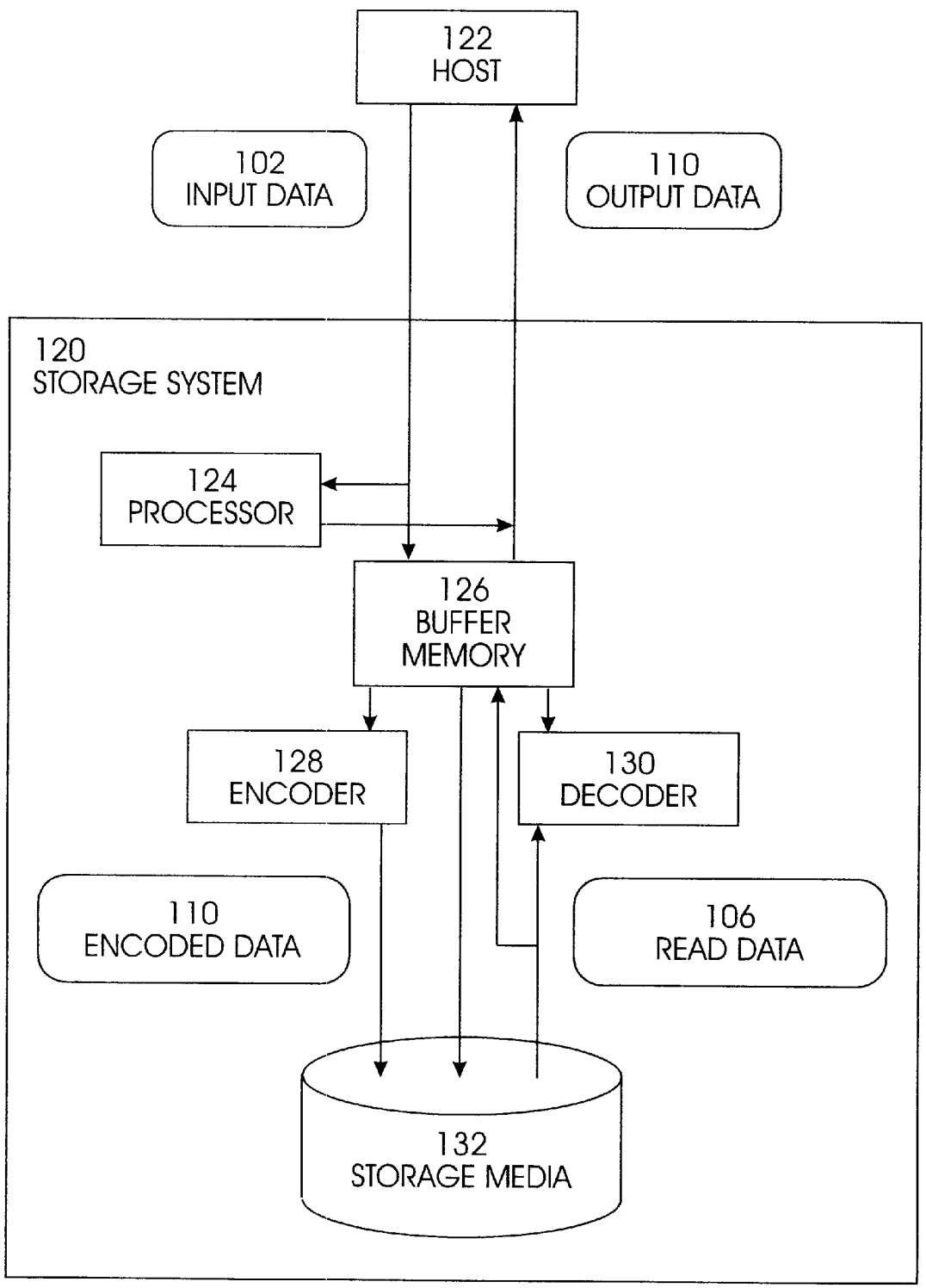
FIG. 1b is a block diagram of an exemplary data storage system, according to the present invention.

An exemplary data storage system 120 is shown in FIG. 1*b*. Storage system 120 may be, for example, a magnetic, optical or magneto-optic disk or tape drive. In a preferred embodiment, storage system 120 is a magnetic hard disk drive. Storage system 120 is connected to a host 122, which is typically a computer system, either stand-alone or networked to other computer systems. Storage system 120 includes processor 124, buffer memory 126, encoder 128, decoder 130 and storage media 132. Processor 124 controls the interface with host 122, as well as the operation of the other components of storage system 120. Processor 124 typically includes a microprocessor and additional logic circuitry, which is typically contained in one or more standard or application specific integrated circuits. Alternatively, processor 124 may not include a microprocessor, but may be entirely composed of discrete or integrated logic circuits. Buffer memory 126 stores data before it has been written to, and after it has been read from, storage media 132. Buffer memory 126 is typically semiconductor random-access memory. Encoder 128 performs encoding and data integrity information generation of data written to storage media 132. Decoder 130 performs data integrity verification and error correction of data read from storage media 132, as well as error correction updates to the data stored in memory buffer 126. Typically encoder 128 and decoder 130 are implemented in hardware logic, due to speed requirements. However, software encoding, decoding and verification may be performed instead. Storage media 132 may be, for example, magnetic disk or tape, optical disk, magneto-optic disk, etc.

In a preferred embodiment, in which storage system 120 is a magnetic hard disk drive, storage media 132 is one or more rotating rigid disks coated with a magnetic material, which are accessed by movable read/write heads and associated circuitry. On such storage media, data is typically arranged in concentric tracks in each disk surface. Within each track, data is typically arranged in a plurality of sectors, each containing a block of data.

When data is transferred in blocks, a cyclic redundancy check (CRC) is often used to detect errors. A CRC works by adding extra information, the redundancy or check symbols, to a block of data before transmission and checking the extra information when it is received. The extra information added is typically much smaller than the information being protected and so the codes are fairly efficient.

Figure 1C:
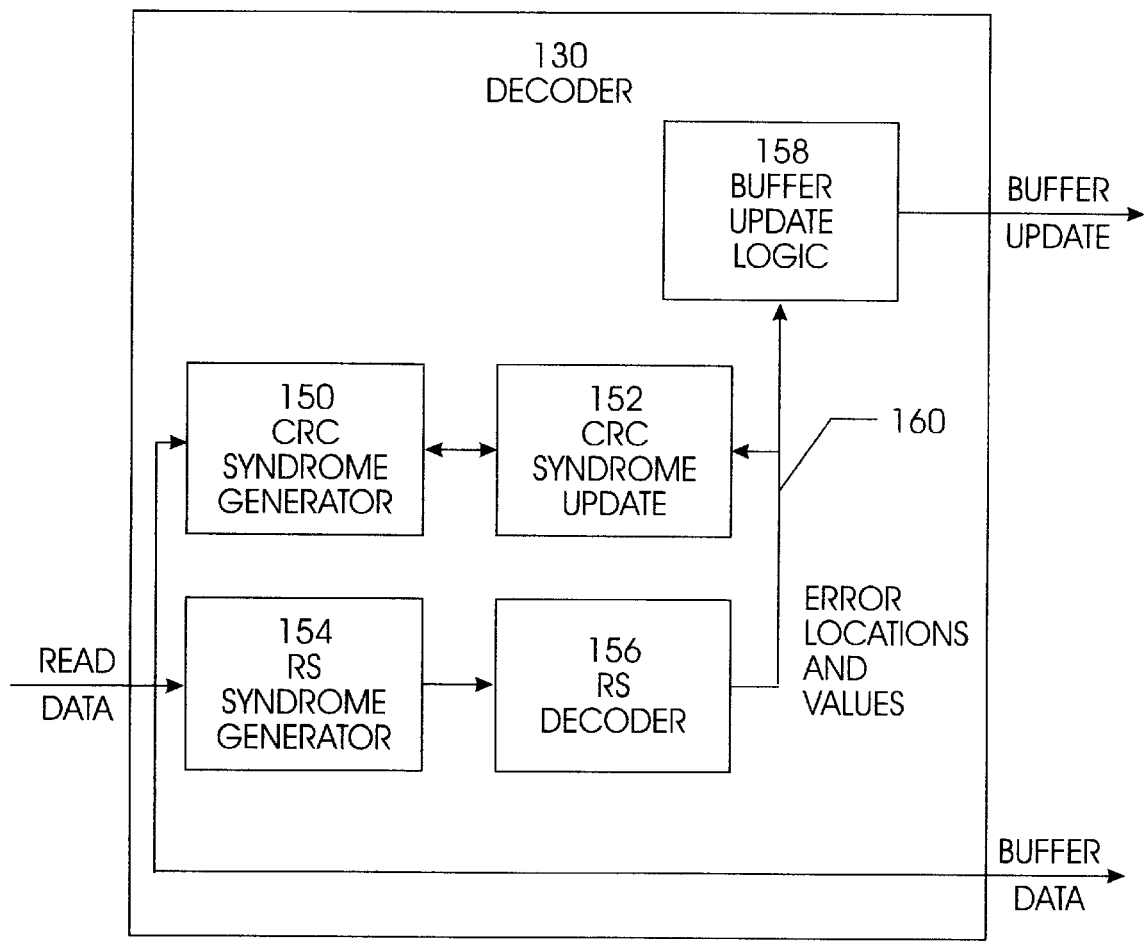
FIG. 1c is a more detailed block diagram of a decoder shown in FIG. 1b.

A data decoder 130, shown in FIG. 1*b*, is shown in more detail in FIG. 1*c*. Decoder 130 includes CRC syndrome generator 150, CRC syndrome update block 152, Reed-Solomon (RS) syndrome generator 154, RS decoder 156 and buffer update logic 158. Read data 106 is input to buffer memory 126, CRC syndrome generator 150, and RS syndrome generator 154. CRC syndrome generator 150 and RS syndrome generator 154 each generates its respective syndromes based on the input read data. RS decoder 156 decodes the read data and attempts to correct any errors indicated by the RS syndromes from RS syndrome generator 154. RS decoder 156 also generates error values and locations 160, which are input to buffer update logic 158 and CRC syndrome update block 152. Buffer update logic 158 updates the data in memory buffer 126 to reflect the corrections of the errors in the data. CRC syndrome update block 152 generates updates to the CRC syndromes and inputs the updates to CRC syndrome generator 150.

Figure 2A:
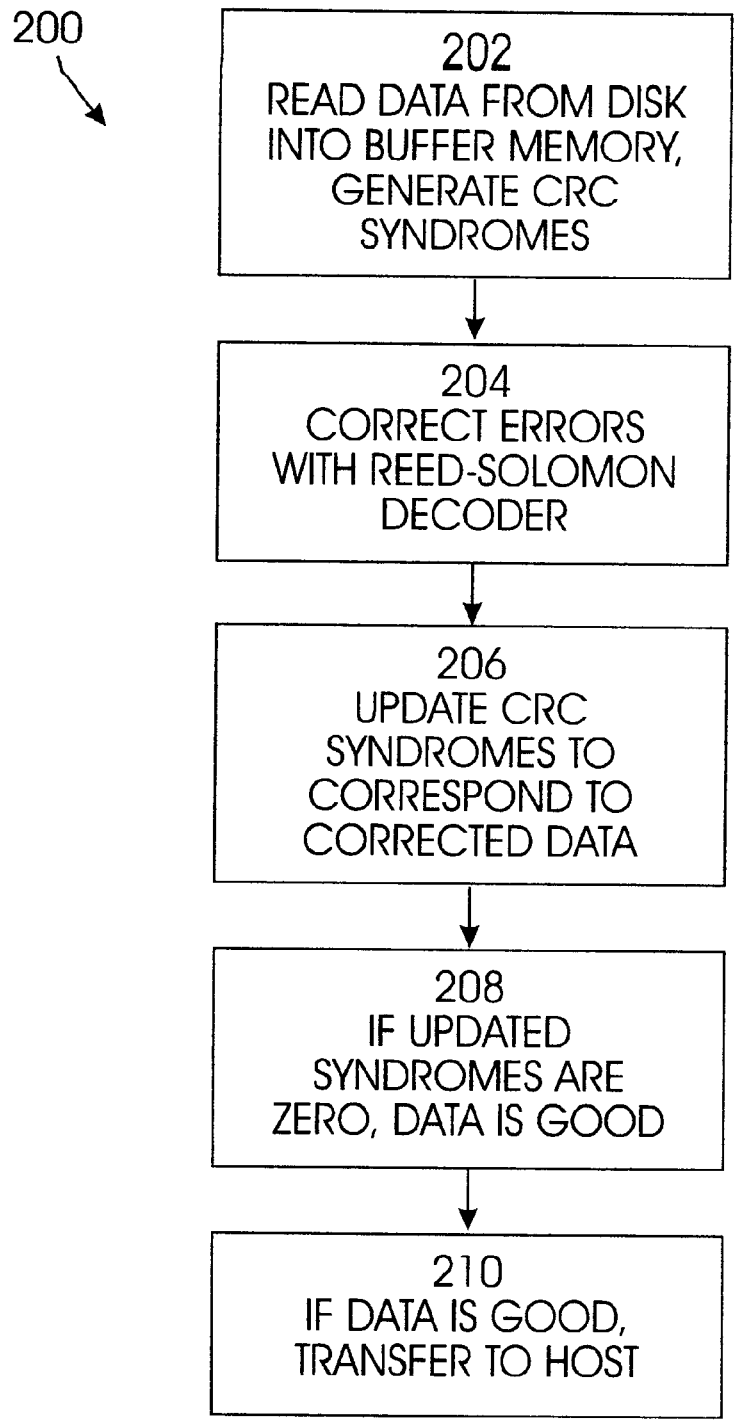
FIG. 2a is a data flow diagram of a data decoding process, according to the present invention, implemented in the storage system shown in FIG. 1b.

A data decoding process 200, implemented in storage system 120, shown in FIG. 1*b*, is shown in FIG. 2*a*. The process begins with step 202, in which a block of data is read from storage media 132 and stored in memory buffer 126. In a preferred embodiment, the storage media is a hard disk and the block of data read is typically one sector. If CRC error detection is being used, each byte of data is used to generate the syndromes of the CRC codeword. This computation is typically performed as the data is being transferred from the storage media to the buffer.

In step 204, those errors, if any, that can be corrected by the Reed-Solomon decoder, are corrected. If errors were corrected by the Reed-Solomon decoder, then the CRC syndromes generated as the data was read (with errors) will not match the data in the buffer after it is corrected and updated by the Reed-Solomon decoder. Therefore, in step 206, CRC syndromes are updated to correspond to the corrected data. One way to generate the CRC syndromes for the updated data would be to read back every byte of the updated data from the buffer and pass it through the syndrome generation logic. The time required to read all the data back would make this scheme unacceptable from a performance point of view. Instead, in step 206, the effect of the errors located by the Reed-Solomon decoder on the CRC syndrome is determined and that effect subtracted from the previously generated syndromes. The individual terms of the error polynomial are evaluated at the roots of the CRC generator polynomial and the results added (recall that addition is performed modulo 2) to the CRC syndromes calculated when the data was read from the disk. In step 208, if the updated syndromes are zero, then the data in the buffer is presumed good. In step 210, if the data is good, it is transferred to the host.

Figure 2B:
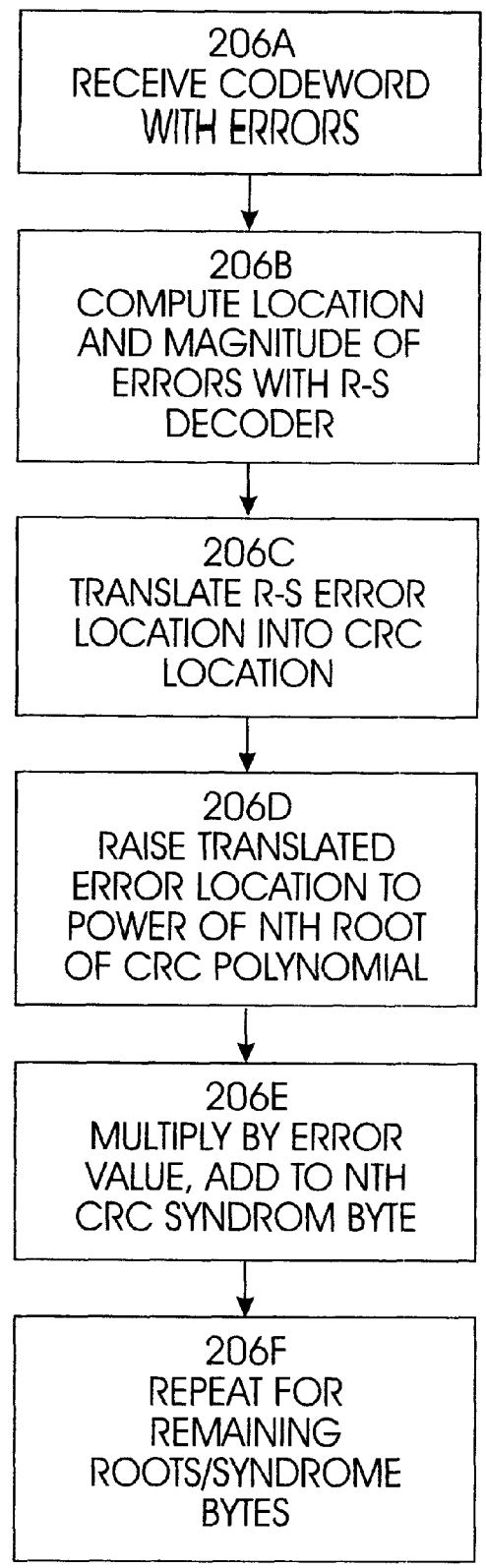
FIG. 2b is a more detailed data flow diagram of step 206 of FIG. 2b.

Step 206 of FIG. 2*a*, in which the CRC syndromes are updated to correspond to the corrected data, is shown in greater detail in FIG. 2*b*. In step 206A, a codeword with errors is received. In step 206B, the Reed-Solomon decoder computes the location and magnitude of the errors. In step 206C, the Reed-Solomon error location is translated into the corresponding location in the CRC codeword. Each location and value pair is one term of the error polynomial. In step 206D, the translated error location is raised to the power of the exponent of the first (or Nth) root of the CRC generator polynomial. The root is a power of $\alpha$, where $\alpha$ is the base element of the finite field. In step 206E, the result is multiplied by the error value and the product added to the corresponding syndrome byte (the first or Nth). In step 206F, steps 206C–E are repeated for the remaining roots.

The difficult operation is the exponentiation of the error location. Raising something to any power of two can be accomplished with a modest hardware cost. A general exponentiation circuit is very expensive. Therefore roots are selected to make the exponentiation a combination of exponentiations by powers of two and multiplications.

As an example, consider the four roots $\alpha^{137}$, $\alpha^{197}$, $\alpha^{227}$, and $\alpha^{242}$. The exponentiation performed in step 206D of FIG. 2b could be achieved with a squaring circuit, a raise to the 16th power circuit, a raise to the 128th power circuit and a multiplier. Call the translated error location Y. Then the derivation of these roots is as follows:

$$X_0 \leftarrow Y^{16}*Y = Y^{17}$$

$$X_1 \leftarrow X_0^{128}*Y = Y^{17*128}*Y = Y^{2177} \equiv Y^{137} \quad \text{(1st root)}$$

$$X_2 \leftarrow X_1^{128}*Y = Y^{137*128}*Y = Y^{17537} \equiv Y^{197} \quad \text{(2nd root)}$$

$$X_3 \leftarrow X_2^{128}*Y = Y^{197*128}*Y = Y^{25217} \equiv Y^{227} \quad \text{(3rd root)}$$

$$X_4 \leftarrow X_3^{128}*Y = Y^{227*128}*Y = Y^{29057} \equiv Y^{242} \quad \text{(4th root)}$$

Each value of X is used to generate the next value of X. Thus, for example, step 206D may be performed for the first translated error location as follows:

The translated error location, Y, is to be raised to the power 137. First, the intermediate quantity $X_0$ is formed by raising Y to the 16th power and multiplying by Y. Thus, $X_0 \leftarrow Y^{16}*Y = Y^{17}$. Then X is formed by raising $X_0$, which is $Y^{17}$, to the 128th power, and multiplying by Y. Thus, $X_1 \leftarrow X_0^{128}*Y = Y^{17*128}*Y = Y^{2177} \equiv Y^{137}$. Since the underlying finite field is cyclic and has 255 non-zero elements, the exponent can be taken modulo 255, and $Y^{2177} \equiv Y^{137}$.

The translated error location is similarly exponentiated by each of the remaining roots. Thus, the translated error location is raised to the power of the exponent of the second root, which is 197, the power of the exponent of the third root, which is 227, and the power of the exponent of the fourth root, which is 242.

A CRC code may be constructed viewing the data to be protected as a sequence of bits or as a sequence of groups of bits. We call such a group of bits a symbol. Codes may be constructed with any length symbol. Many factors are considered when deciding the symbol length for a code. One good criterion is to match the symbol length to the width of the transmission channel. If the data is transferred one bit at a time, then a one-bit symbol may make the most sense. Likewise, for a 16 bit parallel channel, a sixteen-bit symbol size may be appropriate. Other factors also come into play. For a given data transfer rate, a larger symbol size may be easier to encode and decode because the symbol transfer rate would be slower than the bit transfer rate. If multiple codes are used together, then making the CRC symbol match the symbol of the other code is often appropriate.

A code that can be used for error correction, such as a Reed-Solomon code, can also be used for error detection by correcting to less than the full capacity of the code, thus reserving some of the added check symbols for error detection. In a coding scheme that groups multiple Reed-Solomon codewords together for transmission, reserving some Reed-Solomon check symbols for error detection will create a less efficient code than correcting each Reed-Solomon codeword to its maximum capacity and then adding a CRC that covers all of the Reed-Solomon codewords for error detection.

Figure 3A:
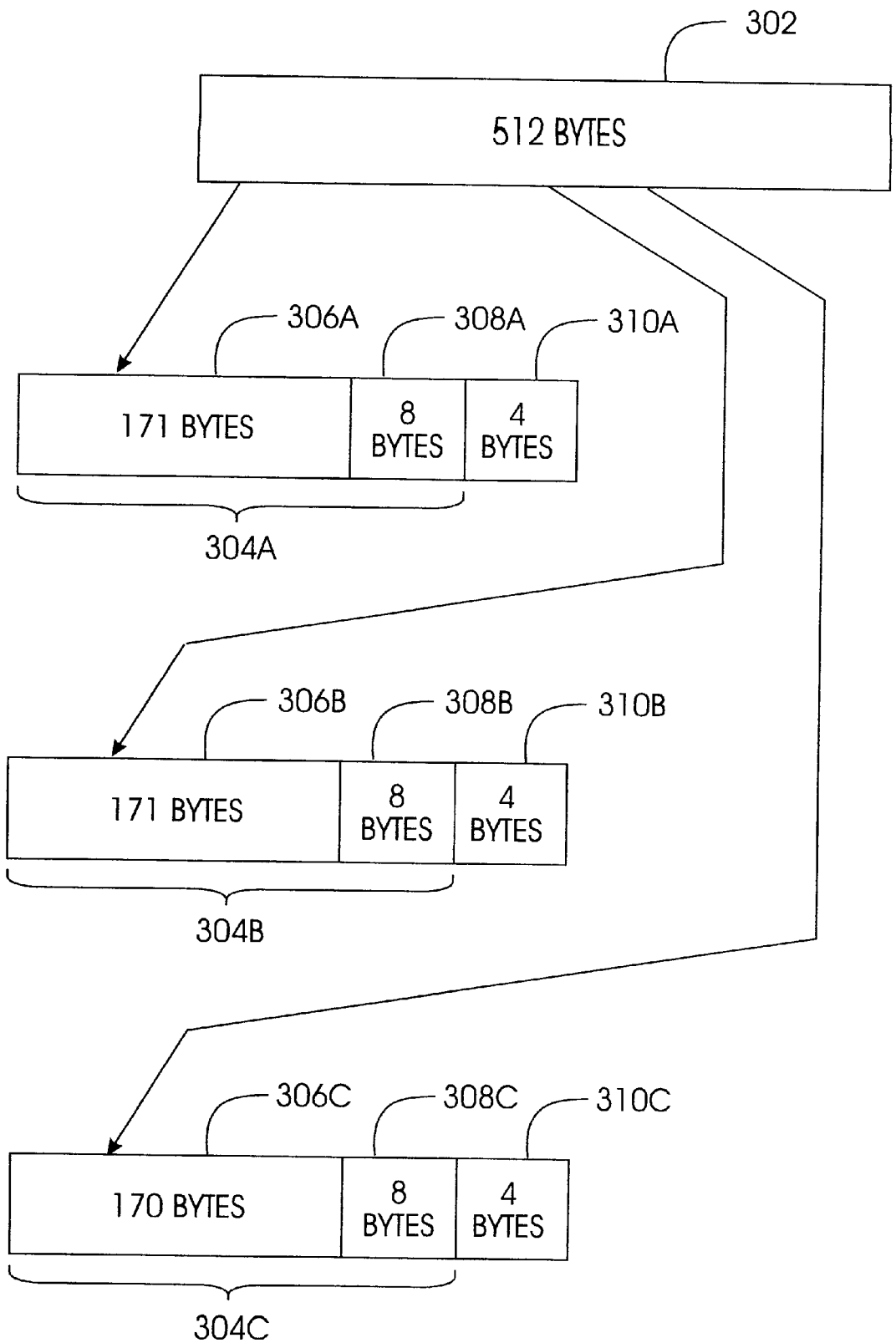
FIG. 3a is an exemplary block diagram of one embodiment of a coding scheme, according to the present invention.

An example of one embodiment of such a coding scheme is shown in FIG. 3a. This example is typical of a disk drive that stores data in 512 byte blocks, or sectors, such as 512 byte block 302. The data is broken into three Reed-Solomon codewords 304A, B and C, built with an eight-bit symbol size. Each codeword 304A, B, or C has a data portion 306A, B, or C, and eight checkbytes 308A, B, or C, capable of correcting up to four errors. It is desired to have an additional four bytes of error detection capability for the sector. Since the data is broken into three distinct codewords, it takes four additional checkbytes per codeword 310A, B and C (twelve for the sector) to provide the desired error detection capability for each byte in the sector.

Figure 3B:
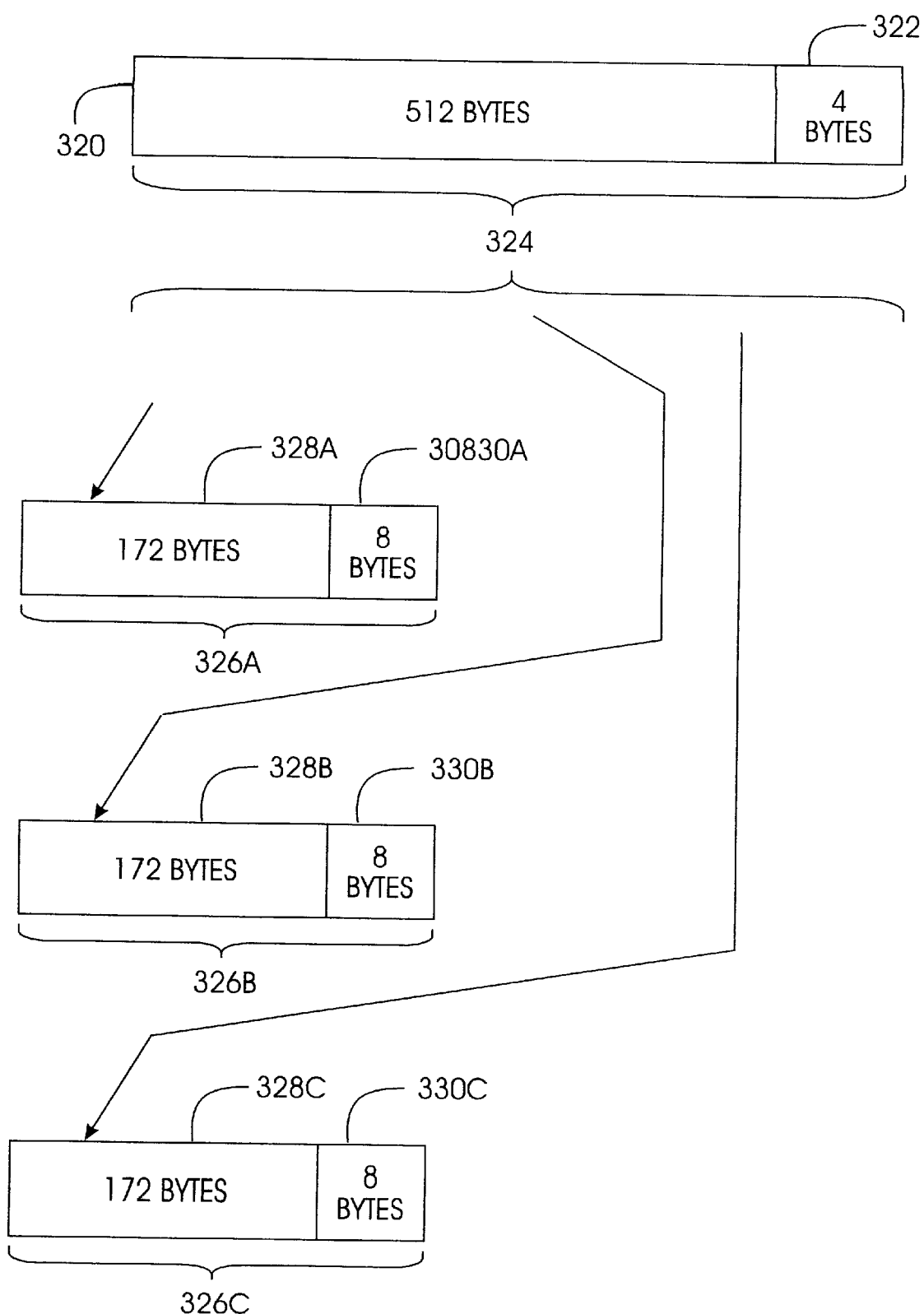
FIG. 3b is an exemplary block diagram of another embodiment of a coding scheme, according to the present invention.

A preferred embodiment of a coding scheme is shown in FIG. 3b. Data portion 320 has 512 bytes of data. A four byte CRC 322 is appended to the 512 bytes of data portion 320 to form the 516-byte block 324. Data block 324 is then broken into three Reed-Solomon codewords 326A, B, and C, each with a data portion 328A, B, and C having 172 bytes of data and 8 checkbytes 330A, B, and C.

Figure 4:
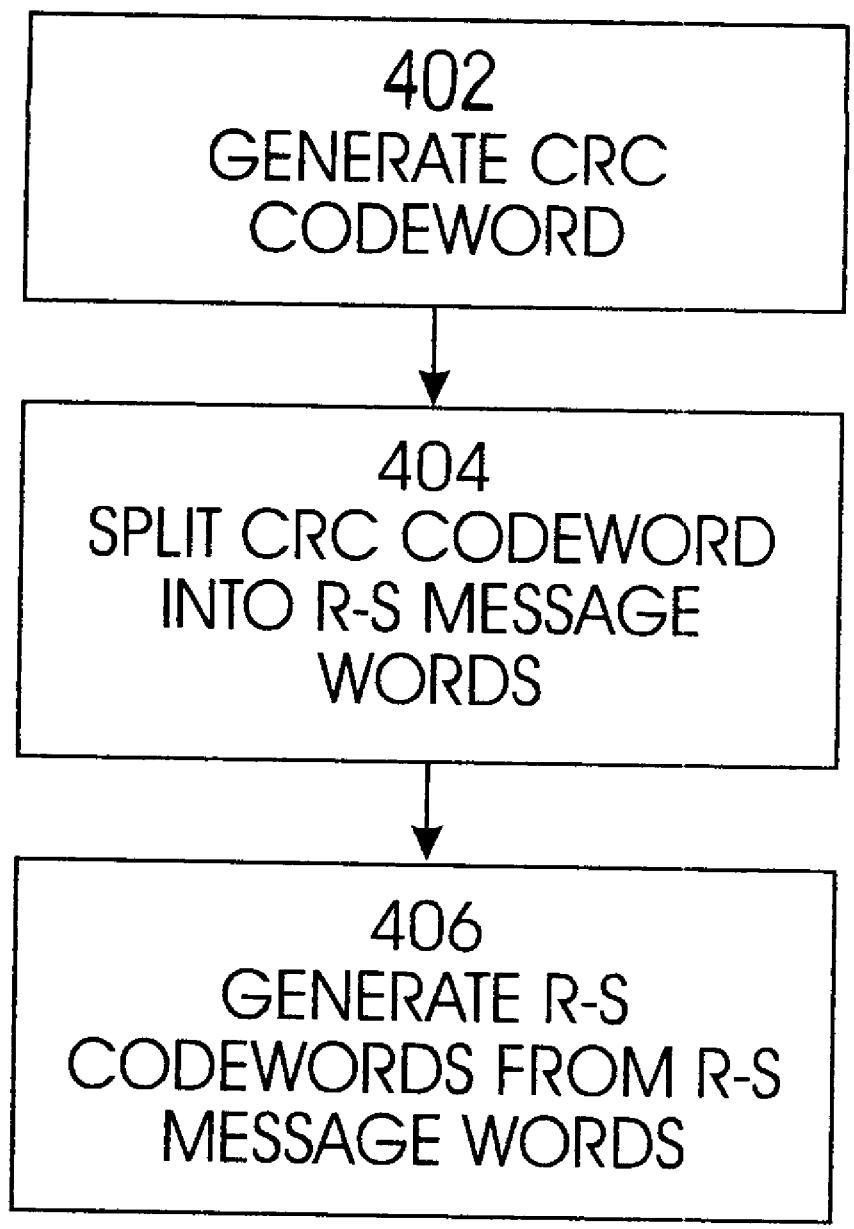
FIG. 4 is a data flow diagram of an encoding process, implemented in the storage system shown in FIG. 1b.

An encoding process, implemented in storage system 120, which is shown in FIG. 1b, is shown in FIG. 4. The process begins with step 402, in which the CRC codeword is generated. The CRC is computed by viewing the 512 bytes of input data as a polynomial. The individual bytes of data are considered to be the coefficients of the message word polynomial. The first byte is the coefficient of the high order term of the polynomial and the last byte is the coefficient of the low order term. The polynomial is a 511th degree polynomial of a dummy variable, y. We will call the CRC message word polynomial $m_c(y)$. The CRC code is based upon a generator polynomial that we will call $g_c(y)$. Since we have four CRC checkbytes, the generator polynomial will be fourth degree. The CRC codeword is the polynomial formed by multiplying the message word polynomial by $y^4$ and adding to the product the remainder of the division of the product by the CRC generator polynomial. Call the CRC codeword polynomial $c_c(y)$. Then $$c_c(y) = y^{4}*m_c(y) + ((y^{4}*m_c(y)) \text{ modulo } g_c(y))$$

By the method of construction of the CRC codeword polynomial, it is seen that the codeword polynomial is evenly divisible by the generator polynomial. Because of this, the codeword polynomial is also evenly divisible by any term of the factored CRC generator polynomial. That is, the CRC codeword will evaluate to zero at any root of the CRC generator polynomial. Indeed, this is the method of checking the validity of a received CRC codeword. The received codeword is evaluated at the four roots of the CRC generator polynomial and if all four evaluations are zero, then the received codeword is deemed valid. The evaluation of the codeword polynomial at the roots of the generator polynomial are called the syndromes of the CRC codeword.

In step 404, the CRC codeword is split into three message words for the Reed-Solomon code. The first byte of the CRC codeword will be the first byte of the first Reed-Solomon message word. The second byte of the CRC codeword will be the first byte of the second Reed-Solomon message word and the third will be the first byte of the third message word. Starting with the first byte of any of the three Reed-Solomon message words, each third byte of the CRC codeword will be in the same Reed-Solomon message word. We will call the three Reed-Solomon message words $m_1(x)$, $m_2(x)$, and $m_3(x)$. Polynomials related to the Reed-Solomon code will be described with the dummy variable x rather than y because the same byte of data will have a different position in the two codes. In step 406, the Reed-Solomon message words are encoded to form Reed-Solomon codewords in a manner similar to the CRC encoding.

The generator polynomial of the Reed-Solomon code has to have roots with sequential exponents in order for the resulting code to be a Reed-Solomon code. For purposes of this example, we will make the eight roots $\alpha^0$ through $\alpha^7$ where $\alpha$ is the base element of the eight bit finite field used to represent the data in the code.

When a Reed-Solomon codeword is received, the syndromes of the codeword are calculated by evaluating the codeword polynomial at the roots of the generator polynomial of the code. Consider a received codeword polynomial r(x). The received codeword polynomial is related to the transmitted codeword polynomial c(x) by: r(x)=c(x)+e(x), where e(x) is a polynomial describing the errors that occurred in transmission and c(x) is the polynomial describing the correct, transmitted Reed-Solomon codeword. By definition, the syndromes of a valid codeword are zero. It can be shown that the syndromes of a received codeword, r(x), are exactly the syndromes of the error polynomial, e(x). If the syndromes are zero, then the error polynomial is assumed to be identically zero and the codeword is presumed to have been received without error. If a received polynomial has been corrupted by more errors than the code is capable of correcting, then the Reed-Solomon decoder will either detect the fact that the correction power has been exceeded, or it will miscorrect the received data. If the Reed-Solomon decoder miscorrects, it will always create a valid Reed-Solomon codeword from the received codeword: a valid codeword, but not the correct valid codeword. That is, the syndromes of the error polynomial, e(x), plus the polynomial describing the changes that the Reed-Solomon decoder introduced, i(x), will be zero.

In the present invention, if the Reed-Solomon decoder miscorrects data, then it is up to the CRC to detect the error. That is, the CRC syndromes calculated on the miscorrected data must be non-zero. The selection of the roots of the CRC generator polynomial is thus critical to insure the desired functionality of the CRC code.

Assume that a received Reed-Solomon codeword contained more errors than the code was capable of correcting and that the decoder miscorrected the data. After the miscorrection, the data differs from the transmitted data by the errors that occurred in transmission, e(x), plus the miscorrections applied by the decoder, i(x). Call the sum d(x): d(x)=e(x)+i(x). Since the decoder miscorrects to a valid Reed-Solomon codeword, the syndromes calculated on d(x) will be zero. The byte positions within d(x) are determined by the exponent of the dummy variable x of the Reed-Solomon codeword polynomial. The position in the Reed-Solomon code is related to the position within the CRC codeword. Specifically, to translate from Reed-Solomon codeword position to CRC codeword position, the number of Reed-Solomon checkbytes is subtracted from the exponent and then the exponent is multiplied by 3 (the CRC codeword was broken into 3 Reed-Solomon message words). Finally, 0, 1, or 2 is added to the exponent depending on which of the three Reed-Solomon codewords we are working with. We will assume the third codeword, and so the final addition is 0. If none of the errors or miscorrected data positions are within the Reed-Solomon checkbytes, then the polynomial d(x) in the Reed-Solomon code space can be translated to d(y) in the CRC code space by:

$$d(y)=d(x^{(-8)}*x)^3=d(x^{(-24)}*x^3)=x^{(-24)}*d(x^3)$$

We know that d(x) evaluates to zero at:
$x=\alpha^0$
$x=\alpha^1$
$x=\alpha^2$
$x=\alpha^3$
$x=\alpha^4$
$x=\alpha^5$
$x=\alpha^6$
$x=\alpha^7$ So, d(y) will evaluate to zero at:
$y=\alpha^0$ because $(\alpha^0)^3=\alpha^0$
$y=\alpha^1$ because $(\alpha^1)^3=\alpha^3$
$y=\alpha^2$ because $(\alpha^2)^3=\alpha^6$ Therefore, $\alpha^0$, $\alpha^1$, and $\alpha^2$ can not be used as roots of the CRC generator polynomial because they would never detect a miscorrection by the Reed-Solomon decoder.

The selection of roots is further limited by the nature of the finite field used to construct the codes. In the field, addition is performed modulo 2. So, for example, squaring is a linear operation.

$$(a+b)^2=a^2+2ab+b^2=a^2+b^2$$

Indeed, raising something to any even power of two is a linear operation. This implies that any polynomial may be raised to any even power of two by simply raising each term of the polynomial by that power of two. If the non-zero coefficients of the polynomial are all identical (and this is a more likely error characteristic in some applications), then this implies that all even powers of two of a root of the polynomial are also roots of the polynomial. This observation further limits the selection of roots of the CRC generator polynomial.

Back to the previous example, assuming that all of the coefficients of d(x) are identical, since d(x) evaluates to zero at $x=\alpha^1$, it will also evaluate to zero at:
$x=\alpha^2$,
$x=\alpha^4$,
$x=\alpha^8$,
$x=\alpha^{16}$,
$x=\alpha^{32}$,
$x=\alpha^{64}$, and
$x=\alpha^{128}$.

Since d(x) is zero at $x=\alpha^3$, then d(x)=0 at:
$x=\alpha^6$,
$x=\alpha^{12}$,
$x=\alpha^{24}$,
$x=\alpha^{48}$,
$x=\alpha^{96}$,
$x=\alpha^{192}$, and
$x=\alpha^{129}$.

Since d(x) is zero at $x=\alpha^5$, d(x)=0 at:
$x=\alpha^{10}$,
$x=\alpha^{20}$,
$x=\alpha^{40}$,
$x=\alpha^{80}$,
$x=\alpha^{160}$,
$x=\alpha^{65}$, and
$x=\alpha^{130}$.

Likewise, since d(x) is zero at $x=\alpha^7$, then d(x)=0 at:
$x=\alpha^{14}$,
$x=\alpha^{28}$,
$x=\alpha^{56}$,
$x=\alpha^{112}$,
$x=\alpha^{224}$,
$x=\alpha^{193}$, and
$x=\alpha^{131}$.

Since our sample application breaks the CRC codeword into three Reed-Solomon message words, we need only be concerned with exponents that are evenly divisible by three.

So the squares of $\alpha^3$ are the ones that concern us. Because of the cyclic nature of the finite field, each square of $\alpha^3$ has three cube roots, not just one. The first root is obvious: the exponent divided by 3. For example, one cube root of $\alpha^6$ is $\alpha^2$. The other two cube roots are the exponent divided by 3 plus 85, and the exponent divided by 3 plus 170. So, $\alpha^{87}$ is a cube root of $\alpha^6$ and $\alpha^{172}$ is a cube root of $\alpha^6$. Including all three cube roots, the squares of $\alpha^3$ eliminate the following as acceptable roots of the CRC polynomial:

$y=\alpha^1$, because $(\alpha^1)^3=\alpha^3$ $y=\alpha^{86}$ because $(\alpha^{86})^3=\alpha^3$ $y=\alpha^{17}$ because $(\alpha^{171})^3=\alpha^3$ $y=\alpha^2$, because $(\alpha^2)^3=\alpha^6$ $y=\alpha^{87}$ because $(\alpha^{87})^3=\alpha^6$ $y=\alpha^{172}$ because $(\alpha^{172})^3=\alpha^6$ $y=\alpha^4$, because $(\alpha^4)^3=\alpha^{12}$ $y=\alpha^{89}$ because $(\alpha^{89})^3=\alpha^{12}$ $y=\alpha^{174}$ because $(\alpha^{174})^3=\alpha^{12}$ $y=\alpha^8$, because $(\alpha^8)^3=\alpha^{24}$ $y=\alpha^{93}$ because $(\alpha^{93})^3=\alpha^{24}$ $y=\alpha^{178}$ because $(\alpha^{178})^3=\alpha^{24}$ $y=\alpha^{16}$ because $(\alpha^{16})^3=\alpha^{48}$ $y=\alpha^{101}$ because $(\alpha^{101})^3=\alpha^{48}$ $y=\alpha^{186}$ because $(\alpha^{186})^3=\alpha^{48}$ $y=\alpha^{32}$ because $(\alpha^{32})^3=\alpha^{96}$ $y=\alpha^{117}$ because $(\alpha^{117})^3=\alpha^{96}$ $y=\alpha^{202}$ because $(\alpha^{202})^3=\alpha^{96}$ $y=\alpha^{64}$ because $(\alpha^{64})^3=\alpha^{192}$ $y=\alpha^{149}$ because $(\alpha^{149})^3=\alpha^{192}$ $y=\alpha^{234}$ because $(\alpha^{234})^3=\alpha^{192}$ $y=\alpha^{128}$ because $(\alpha^{128})^3=\alpha^{129}$ $y=\alpha^{213}$ because $(\alpha^{213})^3=\alpha^{129}$ $y=\alpha^{43}$ because $(\alpha^{43})^3=\alpha^{129}$ We have so far eliminated as possible roots for the CRC generator polynomial any root that when multiplied by 3 would overlap a root in the Reed-Solomon generator polynomial or any power of two of any root in the Reed-Solomon generator polynomial.

The raising to a power of two problem applies also to the CRC roots themselves. If an error happened to escape one root of the CRC generator, then it would escape any other root that was any power of two of that root. Therefore, no two roots of the CRC generator polynomial may share common squares.

The structure of the underlying finite field further constrains the selection of roots. The exponents of the CRC roots may not be equal modulo the prime factors of the cycle length of the finite field. The reason is best demonstrated by an example. Assuming an 8-bit symbol size, 256 element finite field, and a combined error and miscorrection polynomial $d(x)=e(x)+i(x)$. The polynomial may be partially or completely factorable. Assuming that $d(x)$ is at least partially factorable, and that it includes the term $(x^{85}+\alpha^{170})$, $d(x)$ evaluates to zero at any root where the term $(x^{85}+\alpha^{170})$ evaluates to zero. Analyzing the term $(x^{85}+\alpha^{170})$, x, which is one root of the CRC generator polynomial, is of the form $\alpha^R$. Thus:

$x^{85}+\alpha^{170}=0$, $(\alpha^R)^{85}+\alpha^{170}=0$, $(\alpha^R)^{85}=\alpha^{170}$, (85*R) modulo 255=170, and R modulo 3=2.

Therefore, the term $(x^{85}+\alpha^{170})$ evaluates to zero at any root whose exponent is equal to 2 modulo 3. If all the CRC roots share the property of having their exponents equal to 2 modulo 3, then the polynomial $d(x)$ would evaluate to zero at all roots of the CRC generator polynomial. The same type of problem exists for all factors of 255. The way to avoid this problem is to insure that the exponents of the CRC roots are distinct values or all values modulo each prime factor of 255 (3, 5, and 17). There are only three choices for an exponent modulo 3: 0, 1, and 2, and if the exponent is 0 modulo 3, then it is not a primitive element of the field. So, if there are fewer than three roots, then the exponents must be distinct values modulo 3, and if there are more than three roots, then the exponents must cover all values modulo 3.

The cyclic nature of the finite field introduces another constraint on the roots of the CRC generator polynomial. Any element repeatedly multiplied by itself will eventually return a product equal to itself. The number of times that the element can be multiplied by itself before repeating is the cycle length of the element. The longest cycle is 255. For example, $\alpha^1$ multiplied by itself will reach $\alpha^{256}$ after 255 times, and 256 mod 255 is 1. An element with cycle length 255 is a primitive element of the field. Any element whose exponent is relatively prime to 255 is a primitive element. Identical errors spaced exactly the cycle length of a root apart will contribute zero to the CRC syndrome. The chance of multiple errors occurring that would cause the Reed-Solomon decoder to miscorrect in such a fashion as to create a modified error polynomial, $d(x)$, with equal magnitude errors spaced exact distances apart is very small indeed. However, it is prudent to avoid weaknesses where possible, and generator polynomial roots with less than the maximum cycle length of the finite field are more likely to suffer this fate than roots with the maximum cycle length. Therefore, at least one root of the CRC generator polynomial should be a primitive element of the finite field.

The mathematical constraints, which have been discussed, that aid in the selection of appropriate roots, are shown in Table A, in order of importance.

TABLE A

| | |
|---|---|
| 1. | The exponents of the roots are distinct values or all values modulo each prime factor of the cycle length of the underlying finite field. |
| 2. | The roots do not overlap the roots of the Reed-Solomon code used for error correction (including the effects of any interleave factor). |
| 3. | At least one of the roots is a primitive element of the finite field. |
| 4. | No root is a power of two of any other root. |
| 5. | The roots do not overlap any power of two of any root of the Reed-Solomon code used for error correction (including the effects of any interleave factor). |

In addition, an overriding factor is that the roots must possess properties that make the post error correction update of the syndromes easy to compute in hardware. In particular, the roots must be selected to allow the necessary exponentiation operations to be performed using only a combination of exponentiations by powers of two and multiplications.

For a given application, there is likely no set of roots that satisfy all of these constraints. In this case, one may select roots that satisfy constraints 1, 2, and 3, and only partially satisfy constraints 4 and 5. Alternatively, a data alteration scheme, as is described below, may be used.

Figure 5:
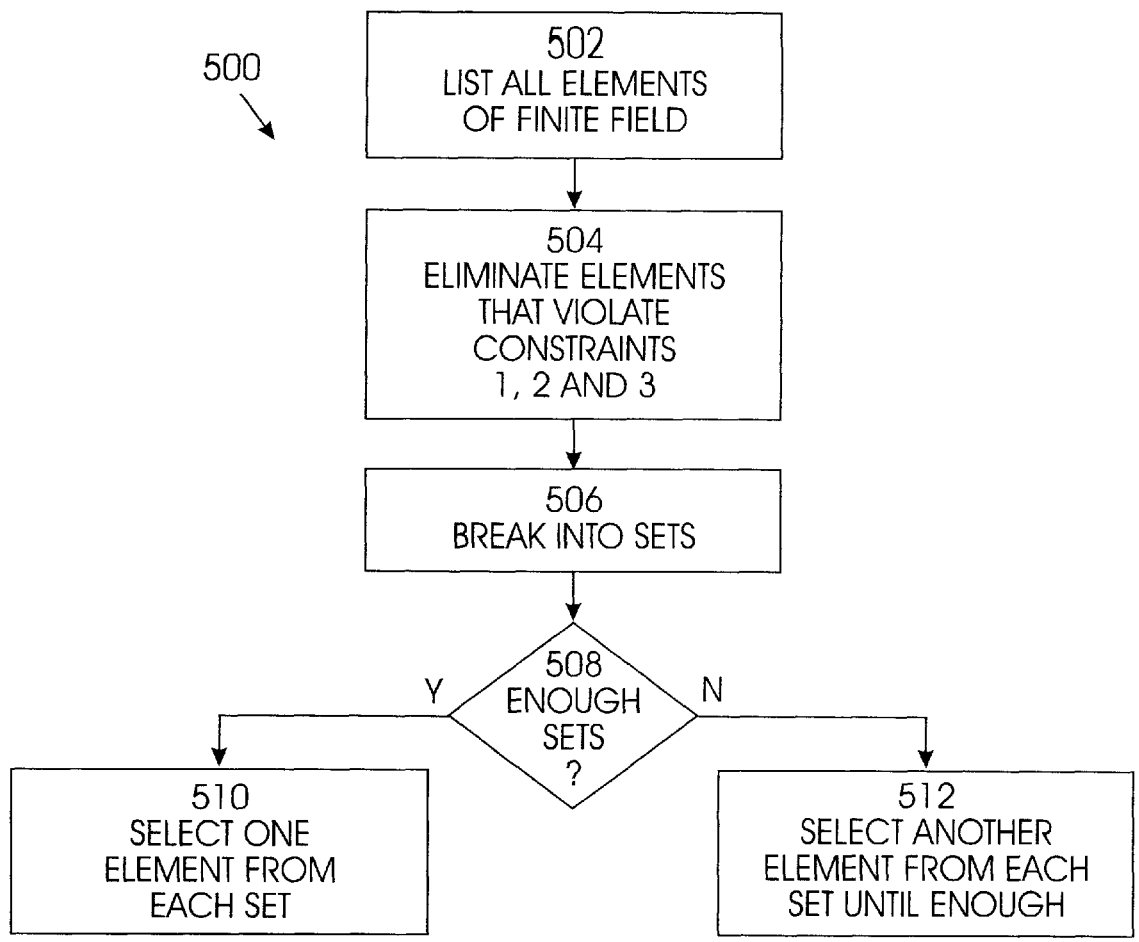
FIG. 5 is a flow diagram of a process for generating roots of a cyclic redundancy check generator polynomial.

A set of roots that satisfy as many constraints as possible, for a given application, may be generated by performing process 500, shown in FIG. 5. The process begins with step 502, in which all elements of the finite field are listed. In step

504, all elements that violate any of the first three constraints above are eliminated. In step 506, the remaining elements are broken into sets where every element in a set is some power of two of every other element in the set. It is seen that no element of such a set is a power of two of any element of any other set. In step 508, it is determined whether the number of sets is equal to or greater than the desired number of roots. If so, the process continues with step 510, in which one element is chosen from each set. The roots are selected so that the exponentiation operation for syndrome update may be accomplished with an acceptable level of computational effort.

If the number of sets is less than the desired number of roots, then the process continues with step 512, in which additional elements are selected. Another element is selected from each set until the desired number of roots has been obtained. Again, the roots are selected so that the exponentiation operation for syndrome update may be accomplished with an acceptable level of computational effort. However, in this case, selection guidelines for constraints 4 and 5 will not be fully realized.

This situation may also arise as the number of roots in the underlying error correcting code increases, because then the number of roots left for the CRC generator polynomial shrinks. At some point, there will be fewer available roots than the desired length of the CRC. It will become necessary to select roots that do not meet all of the selection guidelines.

In addition, the CRC described so far still has a weakness that can not be eliminated by careful selection of the CRC generator polynomial roots. The weakness is that equal magnitude errors spaced a multiple of 255 bytes apart will escape the CRC. This weakness may or may not be considered important depending on the underlying error correcting code (if any) and the specific characteristics of the communications channel being protected.

The problems produced by selecting roots that do not meet all of the selection guidelines, as well as the problem with equal magnitude errors spaced a multiple of 255 bytes apart may be avoided by altering or scrambling the data before the CRC is generated. This results in the CRC and Reed-Solomon code words being generated based on seemingly different data.

Figure 6:
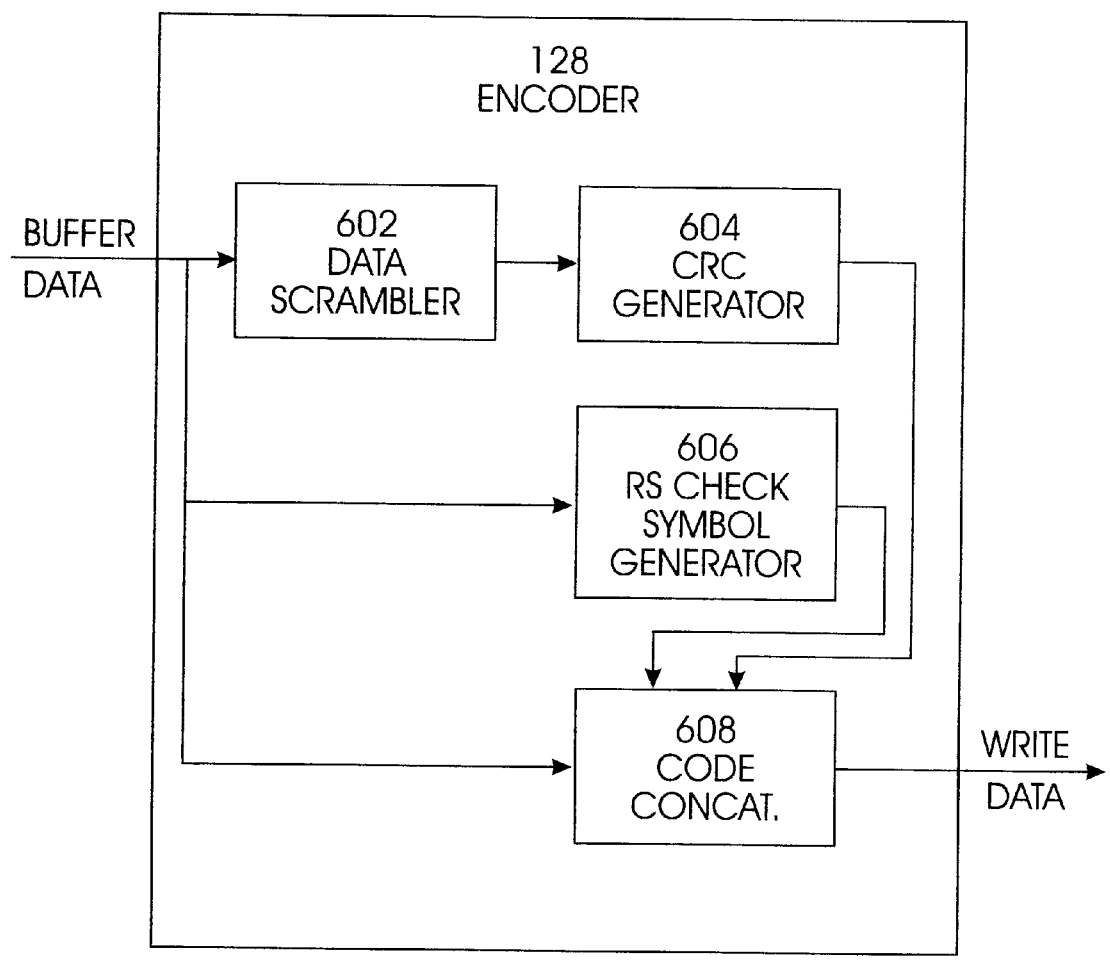
FIG. 6 is an exemplary block diagram of an encoder, according to the present invention.

An exemplary encoder 128, which incorporates data scrambling, according to the present invention, is shown in FIG. 6. Encoder 128 includes data scrambler 602, CRC generator 604, Reed-Solomon check symbol generator 606 and code concatenator 608. Buffer data, from buffer memory 126, is input to data scrambler 602, RS code generator 606 and code concatenator 608. Data scrambler 602 scrambles or alters the buffer data, in essence producing a different stream of data than the buffer data. The scrambled data stream is input to CRC generator 604, which generates the CRC codewords for the scrambled data stream. RS code generator 606 generates Reed-Solomon check symbols for the unaltered buffer data. The generated CRC and Reed-Solomon check symbols are input to code concatenator 608, which inserts the check symbols into the appropriate location in the buffer data stream, and outputs the buffer data with the concatenated check symbols as write data.

One data scrambler that may be used is a simple permutation of the bits of the symbol between the CRC and Reed-Solomon. Although simple to implement, the bit permutation is a hugely non-linear operation and makes the resulting code impossible to analyze mathematically.

A mathematically describable, deterministic alteration of the data stream between the two encoders would be a better solution to the lack of roots problem. With careful design, the same solution will also solve the problem with equal magnitude errors spaced 255 bytes apart.

By definition, the length of the Reed-Solomon codewords will be less than the cycle length of the underlying finite field (255 in our example). So, to break the cycle in the CRC code, we only need to match the solution to the number of Reed-Solomon codewords being protected by the CRC code. For example, if three Reed-Solomon codewords are to be protected, then an interleave factor of three is used between the two codes.

First, we redefine our four byte CRC to be four independent CRC codewords each with a first-degree generator polynomial (of the form x+a=0). The position of a byte in the CRC codeword will determine the exponent of the dummy variable in the codeword polynomial. Meanwhile, the position of the byte in the underlying Reed-Solomon code will determine the alteration of the data byte prior to encoding. The alteration of the byte can be any mathematical operation and the mapping from position to operation can also be nearly anything. For purpose of illustration, we will describe a specific implementation that fits the requirements and is amenable to hardware implementation. During the encoding process, the position of the current byte within the Reed-Solomon code is assumed to be available in the form of an element in the finite field whose exponent is the position. One bit of the binary representation of the position information is assigned to each of the four CRC encoders. If the bit is a zero, then the data is passed to the encoder unmodified. If however, the bit is a one, then the data is multiplied by $\alpha^{254}$ prior to being passed to the encoder.

With this scheme, equal magnitude errors 255 bytes apart will not escape the CRC. They may escape one CRC check, but not all four since the four CRC checks are computed over effectively distinct data streams. The four data streams used by the CRC calculations are also different than the data stream used by the Reed-Solomon encoder, so overlap between CRC generator polynomial roots and Reed-Solomon roots is no longer problematic.

Since the decision to modify a byte for the CRC calculation is based upon the location of the byte in the Reed-Solomon codeword, it is easy to calculate the effect of errors located by the Reed-Solomon decoder on the CRC syndromes calculated on the corrupted data. A deterministically altered error value is generated by performing an operation on the error value based on the error location and the deterministically-altered multiplied error value is used to update the cyclic redundancy check syndrome.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. In a system for transmitting and receiving data, an apparatus for transmitting a block of data comprising a data portion, cyclic redundancy check symbols and Reed-Solomon check symbols, comprising:

a data scrambler operable to generate a deterministically altered data stream based on the data portion of the data block;

a cyclic redundancy code generator operable to generate the cyclic redundancy check symbols based on the deterministically altered data stream; and a Reed-Solomon code generator operable to generate the Reed-Solomon check symbols based on the data portion of the data block and the cyclic redundancy check symbols.

2. The system of claim 1, wherein the data scrambler comprises:
a device operable to perform an operation on a symbol of the data portion based on a position of the symbol within a Reed-Solomon codeword.

3. In a system for transmitting and receiving data, a method of transmitting a block of data comprising a data portion, cyclic redundancy check symbols and Reed-Solomon check symbols, comprising the steps of:
generating the cyclic redundancy check symbols using a cyclic redundancy check generator polynomial having a plurality of roots; and
generating the Reed-Solomon check symbols using a Reed-Solomon generator polynomial having a plurality of roots;
wherein the roots of the cyclic redundancy check generator polynomial meet the following conditions:
a) the exponents of the roots are distinct values or all values modulo each prime factor of the cycle length of the underlying finite field,
b) the roots do not overlap the roots of the Reed-Solomon generator polynomial,
c) at least one of the roots is a primitive element of the finite field,
d) no root is a power of two of any other root, and
e) the roots do not overlap any power of two of any root of the Reed-Solomon generator polynomial.

4. The method of claim 3, wherein the roots are further selected so that data may be exponentiated using the roots by performing a combination of exponentiations by powers of two and multiplications.

5. The method of claim 4, further comprising the step of generating a deterministically altered data stream based on the data portion of the block of data, and wherein:
the step of generating the cyclic redundancy check symbols comprises the step of generating the cyclic redundancy check symbols based on the deterministically altered data stream; and
the step of generating the Reed-Solomon check symbols comprises the step of generating the Reed-Solomon check symbols based on the data portion of the data block and the cyclic redundancy check symbols.

6. The method of claim 5, wherein the step of generating a deterministically altered data stream based on the data portion of the data block comprises the step of:
performing an operation on a symbol of the data portion based on a position of the symbol within a Reed-Solomon codeword.

7. In a system for transmitting and receiving data, a method for transmitting a block of data comprising a data portion, cyclic redundancy check symbols and Reed-Solomon check symbols, comprising the steps of:
generating a deterministically altered data stream based on the data portion of the data block;
generating the cyclic redundancy check symbols based on the deterministically altered data stream; and
generating the Reed-Solomon check symbols based on the data portion of the data block and the cyclic redundancy check symbols.

8. The method of claim 7, wherein the step of generating a deterministically altered data stream based on the data portion of the data block comprises the step of:
performing an operation on a symbol of the data portion based on a position of the symbol within a Reed-Solomon codeword.

9. A method of determining whether received data that contains errors has been properly corrected, comprising the steps of:
receiving a block of data comprising a data portion, cyclic redundancy check symbols generated using a cyclic redundancy check generator polynomial having a plurality of roots and Reed-Solomon check symbols generated using a Reed-Solomon generator polynomial having a plurality of roots, and including at least one error;
generating at least one cyclic redundancy check syndrome for the received block of data using the cyclic redundancy check generator polynomial;
attempting to correct the at least one error in the block of data;
updating the cyclic redundancy check syndrome to correspond to the corrected block of data; and
determining whether the error has been corrected using the updated cyclic redundancy check syndrome;
wherein the cyclic redundancy check symbols and Reed-Solomon check symbols are generated by performing the steps of:
generating a deterministically altered data stream based on the data portion of the data block;
generating the cyclic redundancy check symbols based on the deterministically altered data stream; and
generating the Reed-Solomon check symbols based on the data portion of the data block and the cyclic redundancy check symbols.

10. The method of claim 9, wherein the step of generating a deterministically altered data stream based on the data portion of the data block comprises the step of:
performing an operation on a symbol of the data portion based on a position of the symbol within a Reed-Solomon codeword.

11. The method of claim 10, wherein the step of attempting to correct the errors comprises the step of:
correcting the at least one error using the Reed-Solomon check symbols.

12. The method of claim 11, wherein the step of determining whether the error has been corrected comprises the step of:
determining whether the updated cyclic redundancy check syndromes are zero.

13. The method of claim 12, wherein the received block of data comprises a plurality of Reed-Solomon codewords, each Reed-Solomon codeword comprising a data portion and a Reed-Solomon check symbol, the data portions of the Reed-Solomon codewords forming a cyclic redundancy check codeword comprising a data portion and the cyclic redundancy check symbols, and the step of updating the cyclic redundancy check syndrome comprises the step of:
for each Reed-Solomon codeword containing an error that was attempted to be corrected, performing the steps of:
determining the location and magnitude of the error within the Reed-Solomon codeword;
translating the location of the error within the Reed-Solomon codeword to the location within the cyclic redundancy check codeword;
exponentiating the translated error location by a root of the cyclic redundancy check generator polynomial;
generating a deterministically altered error value by performing an operation on the error value based on the location of the error within the Reed-Solomon codeword;

multiplying the exponentiated translated error location by the deterministically altered error value to form a product; and adding the product to the cyclic redundancy check syndrome.

14. A system for transmitting and receiving data, comprising:

means for transmitting a block of data comprising a data portion, cyclic redundancy check symbols and Reed-Solomon check symbols, comprising:

means for generating the cyclic redundancy check symbols using a cyclic redundancy check generator polynomial having a plurality of roots, and means for generating the Reed-Solomon check symbols using a Reed-Solomon generator polynomial having a plurality of roots; and means for determining whether received data that contains errors has been properly corrected, comprising:

means for receiving the block of data, the block of data including at least one error;

means for generating at least one cyclic redundancy check syndrome for the received block of data using the cyclic redundancy check generator polynomial;

means for attempting to correct the at least one error in the block of data;

means for updating the cyclic redundancy check syndrome to correspond to the corrected block of data; and means for determining whether the error has been corrected using the updated cyclic redundancy check syndrome;

wherein:

the means for transmitting a block of data further comprises means for generating a deterministically altered data stream based on the data portion of the data block;

the means for generating the cyclic redundancy check symbols comprises means for generating the cyclic redundancy check symbols based on the deterministically altered data stream; and the means for generating the Reed-Solomon check symbols comprises means for generating the Reed-Solomon check symbols based on the data portion of the data block and the cyclic redundancy check symbols.

15. The system of claim 14, wherein the means for generating a deterministically altered data stream based on the data portion of the data block comprises:

means for performing an operation on a symbol of the data portion based on a position of the symbol within a Reed-Solomon codeword.

16. The system of claim 15, wherein the means for attempting to correct the errors comprises:

means for correcting the at least one error using the Reed-Solomon check symbols.

17. The system of claim 16, wherein the means for determining whether the error has been corrected comprises:

means for determining whether the updated cyclic redundancy check syndromes are zero.

18. The system of claim 17, wherein the received block of data comprises a plurality of Reed-Solomon codewords, each Reed-Solomon codeword comprising a data portion and a Reed-Solomon check symbol, the data portions of the Reed-Solomon codewords forming a cyclic redundancy check codeword comprising a data portion and the cyclic redundancy check symbols, and the step of updating the cyclic redundancy check syndrome comprises:

means for performing, for each Reed-Solomon codeword containing an error that was attempted to be corrected, the steps of:

determining the location and magnitude of the error within the Reed-Solomon codeword;

translating the location of the error within the Reed-Solomon codeword to the location within the cyclic redundancy check codeword;

exponentiating the translated error location by a root of the cyclic redundancy check generator polynomial;

generating a deterministically altered error value by performing an operation on the error value based on the location of the error within the Reed-Solomon codeword;

multiplying the exponentiated translated error location by the deterministically altered error value to form a product; and adding the product to the cyclic redundancy check syndrome.

19. A system for transmitting and receiving data, comprising:

a device operable to transmit a block of data comprising a data portion, cyclic redundancy check symbols and Reed-Solomon check symbols, comprising:

a cyclic redundancy code generator operable to generate the cyclic redundancy check symbols using a cyclic redundancy check generator polynomial having a plurality of roots, a Reed-Solomon code generator operable to generate the Reed-Solomon check symbols using a Reed-Solomon generator polynomial having a plurality of roots, a data scrambler operable to generate a deterministically altered data stream based on the data portion of the data block, a cyclic redundancy code generator operable to generate the cyclic redundancy check symbols based on the deterministically altered data stream, and a Reed-Solomon code generator operable to generate the Reed-Solomon check symbols based on the data portion of the data block and the cyclic redundancy check symbols; and a device operable to determining whether received data that contains errors has been properly corrected, comprising:

a receiver operable to receive the block of data, the block of data including at least one error;

a cyclic redundancy check syndrome generator operable to generate at least one cyclic redundancy check syndrome for the received block of data using the cyclic redundancy check generator polynomial;

a device operable to attempt to correct the at least one error in the block of data;

a device operable to update the cyclic redundancy check syndrome to correspond to the corrected block of data; and a device operable to determine whether the error has been corrected using the updated cyclic redundancy check syndrome.

20. The system of claim 19, wherein the data scrambler comprises:

a device operable to perform an operation on a symbol of the data portion based on a position of the symbol within a Reed-Solomon codeword.

21. The system of claim 20, wherein the device operable to attempt to correct the errors comprises:

a device operable to correct the at least one error using the Reed-Solomon check symbols.

22. The system of claim 21, wherein the device operable to determine whether the error has been corrected comprises:
a device operable to determine whether the updated cyclic redundancy check syndromes are zero.

23. The system of claim 22, wherein the received block of data comprises a plurality of Reed-Solomon codewords, each Reed-Solomon codeword comprising a data portion and a Reed-Solomon check symbol, the data portions of the Reed-Solomon codewords forming a cyclic redundancy check codeword comprising a data portion and the cyclic redundancy check symbols, and the device operable to update the cyclic redundancy check syndrome comprises:
a device operable to perform, for each Reed-Solomon codeword containing an error that was attempted to be corrected, the steps of:
determining the location and magnitude of the error within the Reed-Solomon codeword;
translating the location of the error within the Reed-Solomon codeword to the location within the cyclic redundancy check codeword;
exponentiating the translated error location by a root of the cyclic redundancy check generator polynomial;
generating a deterministically altered error value by performing an operation on the error value based on the location of the error within the Reed-Solomon codeword;
multiplying the exponentiated translated error location by the deterministically altered error value to form a product; and
adding the product to the cyclic redundancy check syndrome.

24. In a system for transmitting and receiving data, a medium, executable in a computer system, for transmitting a block of data comprising a data portion, cyclic redundancy check symbols and Reed-Solomon check symbols, comprising:
program instructions generating the cyclic redundancy check symbols using a cyclic redundancy check generator polynomial having a plurality of roots, and
program instructions generating the Reed-Solomon check symbols using a Reed-Solomon generator polynomial having a plurality of roots;
wherein the roots of the cyclic redundancy check generator polynomial meet the following conditions:
(a) the exponents of the roots are distinct values or all values modulo each prime factor of the cycle length of the underlying finite field;
(b) the roots do not overlap the roots of the Reed-Solomon generator polynomial: and
(c) at least one of the roots is a primitive element of the finite field;
(d) no root is a power of two of any other root, and
(e) the roots do not overlap any power of two of any root of the Reed-Solomon generator polynomial.

25. The medium of claim 24, wherein the roots are further selected so that data may be exponentiated using the roots by program instructions performing a combination of exponentiations by powers of two and multiplications.

26. The medium of claim 25, further comprising:
program instructions generating a deterministically altered data stream based on the data portion of the block of data, and wherein:
generating the cyclic redundancy check symbols comprises: program instructions generating the cyclic redundancy check symbols based on the deterministically altered data stream; and
program instructions generating the Reed-Solomon check symbols comprises: program instructions generating the Reed-Solomon check symbols based on the data portion of the data block and the cyclic redundancy check symbols.

27. The medium of claim 26, wherein generating a deterministically altered data stream based on the data portion of the data block comprises:
program instructions performing an operation on a symbol of the data portion based on a position of the symbol within a Reed-Solomon codeword.

28. In a system for transmitting and receiving data, a medium, executable in a computer system, for transmitting a block of data comprising a data portion, cyclic redundancy check symbols and Reed-Solomon check symbols, comprising:
program instructions generating the Reed-Solomon check symbols based on the data portion of the data block;
program instructions generating the cyclic redundancy check symbols based on the deterministically altered data stream; and
program instructions generating a deterministically altered data stream based on the data portion of the data block and the cyclic redundancy check symbols.

29. The medium of claim 28, wherein generating a deterministically altered data stream based on the data portion of the data block comprises:
program instructions performing an operation on a symbol of the data portion based on a position of the symbol within a Reed-Solomon codeword.

30. A medium, executable in a computer system, for determining whether received data that contains errors has been properly corrected, comprising:
program instructions receiving a block of data comprising a data portion, cyclic redundancy check symbols generated using a cyclic redundancy check generator polynomial having a plurality of roots and Reed-Solomon check symbols generated using a Reed-Solomon generator polynomial having a plurality of roots, and including at least one error;
program instructions generating at least one cyclic redundancy check syndrome for the received block of data using the cyclic redundancy check generator polynomial;
program instructions attempting to correct the at least one error in the block of data;
program instructions updating the cyclic redundancy check syndrome to correspond to the corrected block of data; and
program instructions determining whether the error has been corrected using the updated cyclic redundancy check syndrome;
wherein the cyclic redundancy check symbols and Reed-Solomon check symbols are generated by:
program instructions generating a deterministically altered data stream based on the data portion of the data block;
program instructions generating the cyclic redundancy check symbols based on the deterministically altered data stream; and
program instructions generating the Reed-Solomon check symbols based on the data portion of the data block and the cyclic redundancy check symbols.

31. The medium of claim 30, wherein generating a deterministically altered data stream based on the data portion of the data block comprises:

program instructions performing an operation on a symbol of the data portion based on a position of the symbol within a Reed-Solomon codeword.

32. The medium of claim 31, wherein attempting to correct the errors comprises:

program instructions correcting the at least one error using the Reed-Solomon check symbols.

33. The medium of claim 32, wherein determining whether the error has been corrected comprises:

program instructions determining whether the updated cyclic redundancy check syndromes are zero.

34. The medium of claim 33, wherein the received block of data comprises a plurality of Reed-Solomon codewords, each Reed-Solomon codeword comprising a data portion and a Reed-Solomon check symbol, the data portions of the Reed-Solomon codewords forming a cyclic redundancy check codeword comprising a data portion and the cyclic redundancy check symbols, and program instructions updating the cyclic redundancy check syndrome for each Reed-Solomon codeword containing an error that was attempted to be corrected, further comprises:

program instructions determining the location and magnitude of the error within the Reed-Solomon codeword;

program instructions translating the location of the error within the Reed-Solomon codeword to the location within the cyclic redundancy check codeword;

program instructions exponentiating the translated error location by a root of the cyclic redundancy check generator polynomial;

program instructions generating a deterministically altered error value by performing an operation on the error value based on the location of the error within the Reed-Solomon codeword;

program instructions multiplying the exponentiated translated error location by the deterministically altered error value to form a product; and program instructions adding the product to the cyclic redundancy check syndrome.

* * * * *